(12) United States Patent
Shieh et al.

(10) Patent No.: US 9,070,779 B2
(45) Date of Patent: Jun. 30, 2015

(54) METAL OXIDE TFT WITH IMPROVED TEMPERATURE STABILITY

(71) Applicants: Chan-Long Shieh, Paradise Valley, AZ (US); Fatt Foong, Goleta, CA (US); Juergen Musolf, Santa Barbara, CA (US); Gang Yu, Santa Barbara, CA (US)

(72) Inventors: Chan-Long Shieh, Paradise Valley, AZ (US); Fatt Foong, Goleta, CA (US); Juergen Musolf, Santa Barbara, CA (US); Gang Yu, Santa Barbara, CA (US)

(73) Assignee: CBRITE Inc., Goleta, CA (US)

( * ) Notice: Subject to any disclaimer, the term of this patent is extended or adjusted under 35 U.S.C. 154(b) by 47 days.

(21) Appl. No.: 13/718,183

(22) Filed: Dec. 18, 2012

(65) Prior Publication Data
US 2014/0167047 A1    Jun. 19, 2014

(51) Int. Cl.
*H01L 29/66* (2006.01)
*H01L 29/786* (2006.01)

(52) U.S. Cl.
CPC ...... *H01L 29/7869* (2013.01); *H01L 29/66969* (2013.01)

(58) Field of Classification Search
None
See application file for complete search history.

(56) References Cited

U.S. PATENT DOCUMENTS

| | | | |
|---|---|---|---|
| 2011/0104841 A1* | 5/2011 | Shieh et al. | 438/34 |
| 2011/0156020 A1* | 6/2011 | Jeon et al. | 257/43 |
| 2011/0263082 A1* | 10/2011 | Yamazaki | 438/158 |

OTHER PUBLICATIONS

Kendrick et al.,"Cooperative mechanisms of fast-ion conduction in gallium-based oxides with tetrahedral moieties", Oct. 2007, Nature Publishing Group, vol. 6, pp. 871-875.*

* cited by examiner

*Primary Examiner* — Steven Loke
*Assistant Examiner* — Juanita B Rhodes
(74) *Attorney, Agent, or Firm* — Robert A. Parsons; Michael W. Goltry; Parsons & Goltry

(57) ABSTRACT

A metal oxide thin film transistor includes a metal oxide semiconductor channel with the metal oxide semiconductor having a conduction band with a first energy level. The transistor further includes a layer of passivation material covering at least a portion of the metal oxide semiconductor channel. The passivation material has a conduction band with a second energy level equal to, or less than 0.5 eV above the first energy level.

16 Claims, 2 Drawing Sheets

METAL OXIDE TFT WITH IMPROVED TEMPERATURE STABILITY

FIELD OF THE INVENTION

This invention generally relates to metal oxide semiconductor films in thin film transistors (TFTs) and more specifically to negative bias temperature stress stability.

BACKGROUND OF THE INVENTION

The thin film transistor with a layer of metal oxide semiconductor as the active channel layer (MOTFT) has attracted great attention for its high carrier mobility and for its potential for next generation displays and thin-film electronics. However, contemporary issues remaining to be solved include operation stability of the current-voltage characteristics of such transistors in dark and under light illumination. These issues are more profound in devices with related high mobility. Due to the difference between broad-band ionic semiconductors and narrow-band covalent semiconductors, the underlying mechanisms of the instabilities in MOTFTs are fundamentally different from those observed in a-Si TFTs.

For a metal oxide TFT under negative bias temperature stress, the metal oxide can go through reduction (i.e. losing oxygen) with the presence of electrons and water leading to a negative shift in threshold voltage ($V_{th}$).

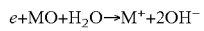

M+loss of oxygen $V_{th}$→negative

This is particularly profound when the TFT is under illumination in which many electrons and holes are generated. One of the strategies to reduce negative bias temperature stress is to limit the presence of water, which at the present time is accomplished chiefly by having a good passivation around the TFT. However, it is difficult and costly to provide a perfect barrier (passivation) to water. Furthermore, any short wavelength light that can be absorbed by the metal oxide semiconductor channel layer has to be blocked in order to reduce the optically induced electrons in the channel layer. In active matrix display applications, it is also difficult to perfectly block light from reaching the channel layer. Some small amount of light will get into the metal oxide layer through scattering and waveguiding. While it may be argued that the amount of moisture entering the TFT and the amount of light impinging on the TFT are small, it must be understood that these effects are occurring over the entire life of the TFT. Therefore, an additional method is desired to reduce the sensitivity of $V_{th}$ shift under negative bias temperature stress with stray light impinging on the metal oxide.

It would be highly advantageous, therefore, to remedy the foregoing and other deficiencies inherent in the prior art.

Accordingly, it is an object of the present invention to provide a new and improved MOTFT with reduced sensitivity to $V_{th}$ shift under negative bias temperature stress with impinging stray light.

It is another object of the present invention to provide new and improved methods and apparatus for reducing the sensitivity of $V_{th}$ shift under negative bias temperature stress with stray light impinging on a MOTFT.

SUMMARY OF THE INVENTION

The desired objects of the instant invention are achieved in accordance with an embodiment thereof wherein a metal oxide thin film transistor includes a metal oxide semiconductor channel with the metal oxide semiconductor having a conduction band with a first energy level. The transistor further includes a layer of passivation material covering at least a portion of the metal oxide semiconductor channel. The passivation material has a conduction band with a second energy level less than, equal to, or less than 0.5 eV above the first energy level.

Briefly, the desired objects of the instant invention are achieved in accordance with a method of fabricating a metal oxide thin film transistor with improved temperature stability including, not necessarily in the order listed, the steps of providing a substrate and forming a gate with a layer of gate dielectric covering at least a portion of the gate and depositing a metal oxide semiconductor layer on the gate dielectric opposite the gate, the metal oxide semiconductor having a conduction band with a first energy level. The method further includes positioning spaced apart source and drain contacts on the metal oxide semiconductor layer and on opposite sides of the gate. The source and drain contacts define a channel area in the metal oxide semiconductor layer between the spaced apart source and drain contacts and in substantial alignment with the gate. A layer of passivation material is positioned on the metal oxide semiconductor channel area. The passivation material has a conduction band with a second energy level, the second energy level being equal to, or less than 0.5 eV above the first energy level.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
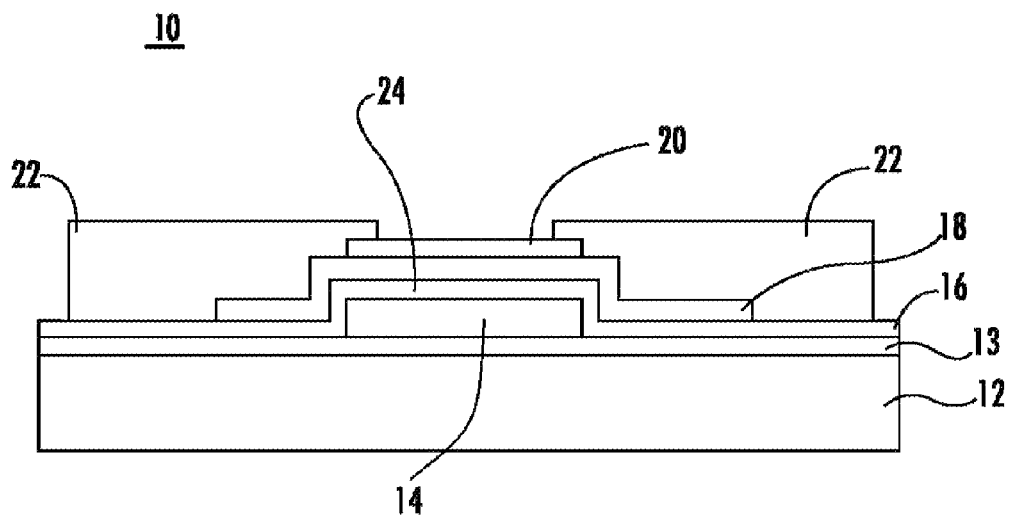
FIG. 1 is a simplified layer diagram of a typical MOTFT with a passivation layer and ohmic source-drain contacts.

Referring specifically to FIG. 1, a simplified layer diagram of a typical MOTFT 10 with a passivation layer and ohmic source-drain contacts is illustrated. In this specific example, MOTFT 10 is a bottom gate and top source/drain metal oxide TFT. It will be understood that the present invention can apply to any of the numerous MOTFTs and MOTFT 10 is simply shown for illustrative purposes only. MOTFT 10 includes a substrate 12 which is typically made of glass or plastic sheet with a proper passivation coating. For certain applications, an additional passivation layer and/or buffer layer is added on the top surface of substrate 12, illustrated by layer 13. For purposes of this disclosure all of the examples (e.g. passivation layer, buffer layer, etc.) will be included in the term "substrate".

MOTFT 10 includes substrate 12 with gate metal 14 patterned thereon. A gate dielectric layer 16 is deposited over gate metal 14 and a metal oxide semiconductor active layer 18 is deposited over dielectric layer 16 so as to insulate active layer 18 from gate metal 14. A passivation layer 20 is patterned on active layer 18 and source/drain contacts 22 are formed on opposite sides of passivation layer 20 on exposed upper surfaces of active layer 18. The space between the source and drain defines the conduction channel, designated 24, for MOTFT 10.

Instead of depositing and patterning the passivation layer 20 before the source/drain layer (as shown in FIG. 1, in which the layer 20 also function as etch-stopper during source/drain layer process), the passivation layer 20 can also be processed on top of the channel after completing S/D layer. Such process sequence is often referred as back-channel-etching structure in a-Si TFT field.

A more complete description of MOTFT 10 and methods of fabrication are described in U.S. Pat. No. 7,977,151, entitled "Double Self-Aligned Metal Oxide TFT" and in several additional patents issuing from the original application, such as U.S. Pat. No. 8,129,720. It is believed that any of the various possible MOTFT configurations could be adapted to the disclosed method including for example a bottom gate, bottom source/drain type of device, a top gate, top source/drain type of device, etc. many of which are disclosed and explained in the above cited patents.

It should be understood that substrate 12 of MOTFT 10 can generally effectively block any water penetration from the substrate side of the device. Also, it is understood that the heavy metal source/drain contacts 22 effectively prevent any moisture from entering the device in those areas. Any water component entering the device comes from the top through any passivation layer or layers, e.g. passivation layer 20, on top of channel 24 and between source and drain contacts 22. As explained above, it is extremely difficult and costly to make the passivation completely water tight and, therefore, over the life of the device some moisture will enter.

Figure 2:
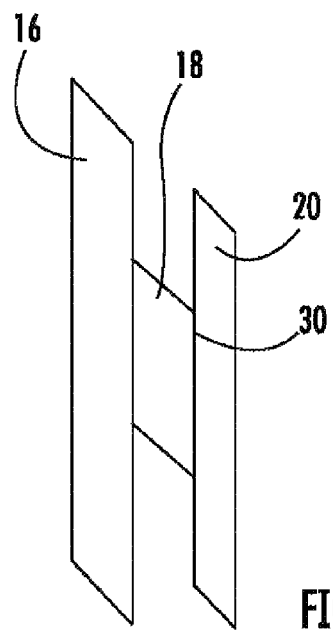
FIG. 2 is a simplified energy band diagram illustrating the MOTFT of FIG. 1 under negative bias.

Referring additionally to FIG. 2 a simplified band diagram under negative bias is illustrated for a MOTFT with typical passivation. As understood from the example in FIG. 1, metal oxide 18 is sandwiched between gate dielectric 16 and passivation material 20. Examples of traditional passivation materials used in silicon based MOTFTs include $SiO_2$, $Al_2O_3$, SiN, and the like. Thermally or optically generated electrons accumulate at the metal oxide-passivation interface, designated 30 in FIG. 2. The higher the temperature or the stronger the illumination, the more electrons that are generated to accumulate at interface 30. In a TFT with metal-oxide semiconductor as the channel material, the oxide reduction process occurs most easily at interface 30 where moisture is most abundant and the electron concentration is highest under the negative bias stress. It should be noted that the reduction process is also a positive feedback process. That is, the oxide reduction tends to make the $V_{th}$ more negative which increases the number of electrons available for the reduction process. This positive feedback process makes the $V_{th}$ shift very sensitive to (1) humidity, (2) light illumination, and (3) oxygen vacancies at the oxide-passivation interface.

One way to break the positive feedback loop is to make sure that the interface has very few oxygen vacancies to start with. However, the oxygen vacancies are constrained by the $V_{th}$ value and cannot be adjusted at will. A strategy of the present invention is that by careful arrangement of band alignment at the channel-passivation interface, the electrons in the metal oxide channel layer can be transferred to the passivation materials. In addition to the band alignment, the passivation materials are chosen to be less susceptible to the reduction process even with the presence of electrons and moisture. Since the passivation material is not used for switching electric current, there are more options available for material selection. This strategy is particularly effective when the MOTFT is under illumination where many electrons and holes are generated and electrons have to be transferred out of the metal oxide to avoid the reduction process in the presence of water molecules.

Figure 3:
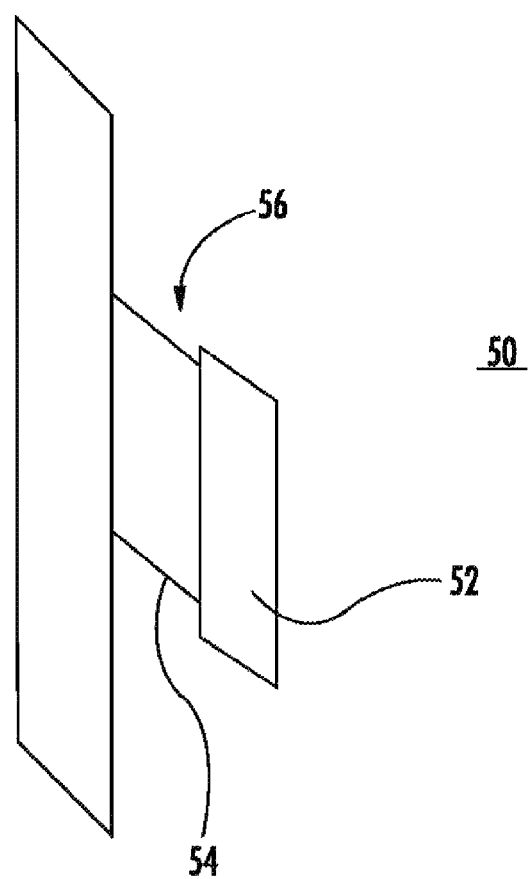
FIG. 3 is a simplified energy band diagram illustrating a MOTFT under negative bias with optimized passivation layer in accordance with the present invention.

Turning to FIG. 3, a simplified energy band diagram is illustrated showing a MOTFT, designated 50, under negative bias with optimized passivation layer in accordance with the present invention. As can be seen from FIG. 2, when the conduction band of passivation material 20 is much higher than the conduction band of semiconducting oxide material 18 (i.e. high energy barrier), then the transfer of electrons from semiconducting metal oxide 18 to passivation material 20 is not effective and the electrons will accumulate at interface 30. As illustrated in the energy band diagram of FIG. 3, an optimized passivation layer 52 is chosen such that the energy level of the conduction band of passivation material 52 is close to the energy level of the conduction band of the metal oxide 54 (see specifically the area designated 56). For the purpose of this disclosure, "close" is defined as the conduction band of passivation material 52 being equal to, or less than 0.5 eV above the conduction band of metal oxide 54.

Choosing a passivation material with a conduction band close to the conduction band of the metal oxide semiconductor material facilitates the transfer of electrons from the semiconducting metal oxide to the passivation material by the bias field as shown in FIG. 3. By spreading electrons into electron transferring passivation layer 52, there are fewer electrons for oxide reduction in the channel layer of the metal oxide semiconductor and, thus, the bias temperature stress stability is improved and the MOTFT is less susceptible to the reduction process through moisture even with the presence of electrons.

Examples of passivation materials that can be used with typical semiconductor metal oxides include $Ta_2O_5$, $TiO_2$, $V_2O_5$, $Nb_2O_5$, $W_2O_3$, $ZrO_2$, $HfO_2$, $Sc_2O_3$, $Y_2O_3$, $La_2O_3$, $Ga_2O_3$, MgO or combinations thereof. The passivation layer can also be made in blend oxide form comprising at least one of the metal oxides listed above and a fraction of insulating compounds. These materials can be deposited by one of vacuum deposition methods including physical deposition such as thermal deposition or sputter deposition, CVD, or spray pyrolysis. When patterning is needed (such as in the case shown in FIG. 1), this layer can be patterned by one of lithography processes known to experts in the field. In one of special cases, the blend oxide passivation film can be made in a pre-cursor form which is photopatternable directly and then converted into the final form described above.

To retain the current switching ratio that is presently available in typical MOTFTs under high bias conditions, the passivation material needs to be substantially more insulating than the channel layer, even with a low conductivity channel layer. That is the passivation material preferably is chosen to be substantially more insulating or less conductive than metal oxide with conductivity less than $10^{-10}$ S/cm. Not only should the passivation layer be much less conductive than the channel layer but the ratio of the channel layer conduction to the conduction of the passivation layer should remain relatively constant. Further, the insulating value of the passivation material should be retained after electron transfer from the metal oxide channel layer. This could be achieved, for example, by selecting a proper metal-oxide passivation material (see examples above) in which the metal includes a variable valence and the passivation material retains a desired electrical insulation at different oxidation/reduction stages. One specific example is tantalum-oxide in which the insulating $Ta_2O_5$ can be reduced into insulating $TaO_2$ and $Ta_2O_3$ after transferring electrons from the metal-oxide channel layer.

In addition to selecting a passivation material with an energy level alignment close to that of the metal oxide semiconductor channel layer, it is preferable that the passivation material has an optical gap larger than the optical gap of the metal oxide semiconductor channel layer.

The present invention provides a new and improved MOTFT with reduced sensitivity to $V_{th}$ shift under negative bias temperature stress with impinging stray light. Further, new and improved methods and apparatus for reducing the sensitivity of $V_{th}$ shift under negative bias temperature stress with stray light impinging on a MOTFT are disclosed. Primarily, a MOTFT under negative bias is disclosed with optimized passivation layer in accordance with the present invention.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A metal oxide thin film transistor comprising:
   a metal oxide semiconductor layer having a metal oxide semiconductor channel defined therein, the metal oxide semiconductor layer having a conduction band with a first energy level; and
   a layer of passivation material covering at least a portion of the metal oxide semiconductor channel, the passivation material having a conduction band with a second energy level, the second energy level being equal to, or less than 0.5 eV above the first energy level, such that a barrier between the metal oxide semiconductor channel and the passivation layer is reduced allowing carriers to be drained off into the passivation layer.

2. A metal oxide thin film transistor as claimed in claim 1 wherein the passivation material includes one of $Ta_2O_5$, $TiO_2$, $V_2O_5$, $Nb_2O_5$, $W_2O_3$, $ZrO_2$, $HfO_2$, $Sc_2O_3$, $Y_2O_3$, $La_2O_3$, $Ga_2O_3$, MgO or combinations thereof.

3. A metal oxide thin film transistor as claimed in claim 1 wherein the passivation material is substantially more insulating or less conductive than the metal oxide semiconductor layer and has a conductivity less than $10^{-10}$ S/cm.

4. A metal oxide thin film transistor as claimed in claim 3 wherein a ratio of the metal oxide semiconductor layer conduction to the conduction of the passivation layer remains relatively constant, whereby a current switching ratio of the transistor remains relatively constant.

5. A metal oxide thin film transistor comprising:
   a substrate;
   a gate supported by the substrate;
   a layer of gate dielectric covering at least a portion of the gate;
   a metal oxide semiconductor channel positioned on the layer of gate dielectric in overlying relationship to the gate, the metal oxide semiconductor channel having a conduction band with a first energy level;
   metal source/drain contacts positioned on the metal oxide semiconductor channel on opposite sides of the gate; and
   a layer of passivation material covering at least a portion of the metal oxide semiconductor channel between the source/drain contacts, the passivation material having a conduction band with a second energy level, the second energy level being equal to, or less than 0.5 eV above the first energy level, such that a barrier between the metal oxide semiconductor channel and the passivation layer is reduced allowing carriers to be drained off into the passivation layer.

6. A metal oxide thin film transistor as claimed in claim 5 wherein the passivation material includes one of $Ta_2O_5$, $TiO_2$, $V_2O_5$, $Nb_2O_5$, $W_2O_3$, $ZrO_2$, $HfO_2$, $Sc_2O_3$, $Y_2O_3$, $La_2O_3$, $Ga_2O_3$, MgO or combinations thereof.

7. A metal oxide thin film transistor as claimed in claim 6 wherein the passivation material is substantially more insulating or less conductive than the metal oxide semiconductor channel and has a conductivity less than $10^{-10}$ S/cm.

8. A metal oxide thin film transistor as claimed in claim 7 wherein a ratio of a conduction of the metal oxide semiconductor channel to the conduction of the passivation layer remains relatively constant, whereby a current switching ratio of the transistor remains relatively constant.

9. A method of fabricating a metal oxide thin film transistor with improved temperature stability comprising, not necessarily in the order listed, the steps of:
   providing a substrate and forming a gate with a layer of gate dielectric covering at least a portion of the gate;
   depositing a metal oxide semiconductor layer on the gate dielectric opposite the gate, the metal oxide semiconductor layer having a conduction band with a first energy level;
   positioning spaced apart source and drain contacts on the metal oxide semiconductor layer and on opposite sides of the gate, the source and drain contacts defining a channel area in the metal oxide semiconductor layer between the spaced apart source and drain contacts and in substantial alignment with the gate; and
   positioning a layer of passivation material on the metal oxide semiconductor channel area, the passivation material having a conduction band with a second energy level, the second energy level being equal to, or less than 0.5 eV above the first energy level, such that a barrier between the metal oxide semiconductor channel and the passivation layer is reduced allowing carriers to be drained off into the passivation layer.

10. A method as claimed in claim 9 wherein the step of positioning the layer of passivation material includes vacuum deposition methods.

11. A method as claimed in claim 10 wherein the step of positioning the layer of passivation material by vacuum deposition methods includes one of thermal deposition, sputter deposition, CVD, and spray pyrolysis.

12. A method as claimed in claim 9 wherein the step of positioning the layer of passivation material includes patterning by one of lithography processes.

13. A method as claimed in claim 9 wherein the step of positioning the layer of passivation material includes selecting a passivation material including one of $Ta_2O_5$, $TiO_2$, $V_2O_5$, $Nb_2O_5$, $W_2O_3$, $ZrO_2$, $HfO_2$, $Sc_2O_3$, $Y_2O_3$, $La_2O_3$, $Ga_2O_3$, MgO or combinations thereof.

14. A method as claimed in claim 9 wherein the step of positioning a layer of passivation material includes selecting a passivation material substantially more insulating or less conductive than the metal oxide semiconductor layer and having conductivity less than $10^{-10}$ S/cm.

15. A method as claimed in claim 14 wherein the steps of depositing a metal oxide semiconductor layer and positioning a layer of passivation material includes selecting the metal oxide and the passivation material so that a ratio of the metal oxide semiconductor conduction to the conduction of the passivation material remains relatively constant, whereby a current switching ratio of the transistor remains relatively constant.

16. A method as claimed in claim 9 wherein the step of positioning the layer of passivation material is performed one of before the step of positioning the spaced apart source and drain contacts and after the step of positioning the spaced apart source and drain contacts.

\* \* \* \* \*